(12) United States Patent
Campbell et al.

(10) Patent No.: US 6,838,653 B2
(45) Date of Patent: Jan. 4, 2005

(54) SHARED PHOTODETECTOR PIXEL IMAGE SENSOR

(75) Inventors: Scott Patrick Campbell, Sunland, CA (US); Eric R. Fossum, La Crescenta, CA (US)

(73) Assignee: Micron Technology, Inc., Boise, ID (US)

( * ) Notice: Subject to any disclaimer, the term of this patent is extended or adjusted under 35 U.S.C. 154(b) by 7 days.

(21) Appl. No.: 10/388,546

(22) Filed: Mar. 17, 2003

(65) Prior Publication Data

US 2004/0016869 A1 Jan. 29, 2004

Related U.S. Application Data

(63) Continuation of application No. 09/681,639, filed on May 15, 2001, now Pat. No. 6,552,322.
(60) Provisional application No. 60/204,370, filed on May 16, 2000.

(51) Int. Cl.$^7$ .............................................. H01L 27/00
(52) U.S. Cl. ................................ 250/208.1; 250/214 R
(58) Field of Search ........................ 250/208.1, 214 R, 250/214.1, 214 LS; 348/294, 308, 316; 257/291, 292

(56) References Cited

U.S. PATENT DOCUMENTS 5,962,844 A  * 10/1999  Merrill et al. ............ 250/214 A
6,160,281 A    12/2000  Guidash
6,552,322 B1 *  4/2003  Campbell et al. ......... 250/208.1

* cited by examiner

Primary Examiner—Que T. Le
(74) Attorney, Agent, or Firm—Dickstein Shapiro Morin & Oshinsky LLP

(57) ABSTRACT

A shared photodetector active pixel sensor uses a single photodetector between two different active pixels. The photodetector has a number of connection portions, which allow connecting to the different photodetector portions.

30 Claims, 2 Drawing Sheets

SHARED PHOTODETECTOR PIXEL IMAGE SENSOR

CROSS REFERENCE TO RELATED APPLICATIONS

This application is a continuation of U.S. patent application Ser. No. 09/681,639, filed on May 15, 2001, now U.S. Pat. No. 6,552,322 which claims the benefit of the U.S. Provisional Application No. 60/204,370, filed May 16, 2000, whereby the entire contents of both are hereby incorporated by reference.

BACKGROUND OF INVENTION

Active pixel sensors and other image sensors often have a trade-off between size of pixels in the sensor and the abilities of the sensor. More pixels may be more desirable, since it may enable the system to acquire light with a higher resolution. However, more pixels can only be added by either increasing the size of the substrate on which the pixels are located, or by reducing the size of the pixels themselves. In order to accommodate this trade-off, it may become important that the pixels be efficiently placed on the substrate. The fill factor refers to the way in which the pixels are placed on the substrate.

Different pixel arrangements may have advantages in different situations. For example, active pixel sensors may be used for image acquisition, moving picture acquisition in either interlaced or non-interlaced format, and/or in freeze frame operations.

SUMMARY OF INVENTION

The present application teaches dual use of photodetectors on a substrate.

Photodetectors often accounts for one of the largest real estate use on the pixel substrate. In an embodiment, a plurality of the photodetectors are associated with structure that allows the single photodetector to be used with several different pixels.

BRIEF DESCRIPTION OF DRAWINGS

These and other aspects of the invention will be described in detail with reference to the accompanying drawings, wherein.

DETAILED DESCRIPTION

The present inventors recognized that the photodetector on an image sensor chip, such as an active pixel sensor, often takes up a large amount of area/real estate on the chip. In order to lower the fill factor in certain image sensors such as a freeze frame image sensor, the present system defines a device that shares a single photodetector among several pixels.

Figure 1:
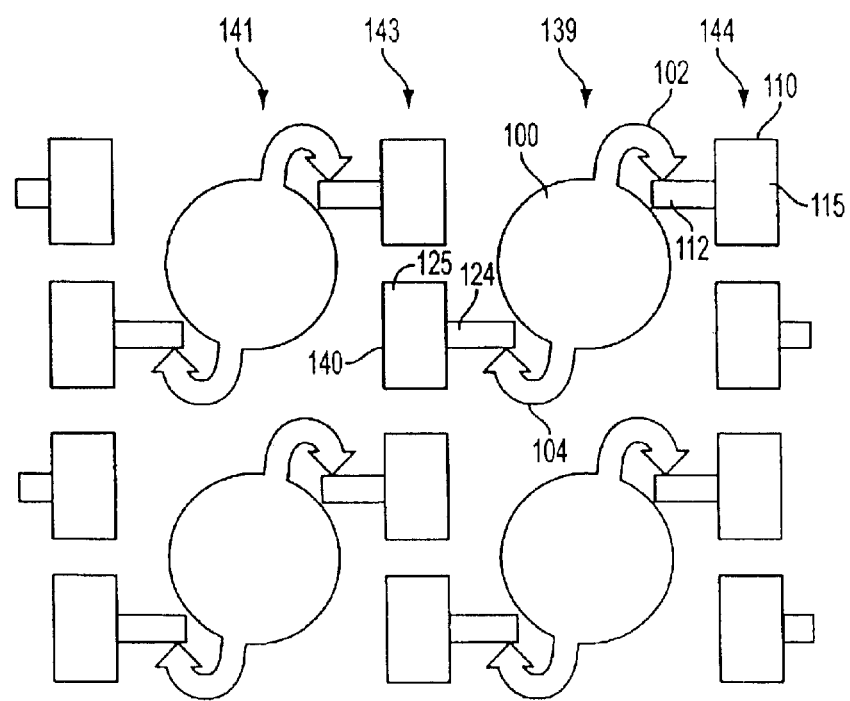
FIG. 1 shows a basic diagram of a shared photodetector active pixel sensor.

An embodiment is shown in FIG. 1. FIG. 1 shows four different photodetectors. Each photodetector such as 100 is shared between two different pixels.

At a first time, photodetector 100 accumulates signal representative of information for pixel 110. At a second time, photodetector accumulates signal for pixel 140. The photodetector 100 includes a first drain path 102 and a second drain path 104, both of which may always have the signal output thereon. A connection to the first drain path 102 provides the photodetector output to a first pixel 110. The connection includes a switch part 112 and a storage cell 115. The switch is activated two coupled to signal from drain path 102 to the storage cell 115.

The second drain path 104 analogously includes a switch 124 leading between the second drain path 104, and a second storage cell 125 for a second pixel 140. Hence, the same photodetector 100 provides outputs indicative of incoming light to the two different pixels 110, 140.

Light is continuously incident on the photodetector 100, and the outputs may continuously provide electrical or other signals indicative of the incident light. The photodetector 100 can be any conventional kind of photodetector including, but not limited to, a photodiode or photogate. The effect of the light on the photodetector is represented by the output signal from the photodetector.

This output signal is only sent to the corresponding storage cell when the appropriate switch 112, 124 is active. That is, the light induced signal is sent to storage cell 115 when the switch 112 is activated. The light induced signal is sent to storage cell 125 when the switch 124 is active. The light induced signal typically may be a signal indicative of the intensity of the light received in the photodetector 100.

After coupling the light intensity proportional signal to the storage cell, e.g. 115, the switch 112 is disconnected. The photodetector can subsequently be coupled via switch 124 to storage cell 125. In this way, several storage cells 115, 125 can become effective pixels in the sensor array, both obtaining their signals from a single photodetector 100.

While the above embodiment has disclosed each photodetector being coupled to two different sites, it should be understood that the photodetector could be coupled to multiple different sites e.g. four different sites for example.

The layout of the cell may be generally as shown in FIG. 1. The photodetectors may be arranged in rows 139, 141, with each photodetector communicating with two different storage cells on opposite sides of the photodetector. The storage cells may also be generally arranged in straight-line rows 143, 144. Each cell may be located between a row of pixels; for example row 143 is located between the rows 139, 141. In addition, the rose may be substantially parallel, so that the line 139 defining the row of photodetectors may be substantially parallel to the line 143 defining the row of storage cells.

Alternatively, the storage cells may surround the pixel in any desired way.

Figure 2:
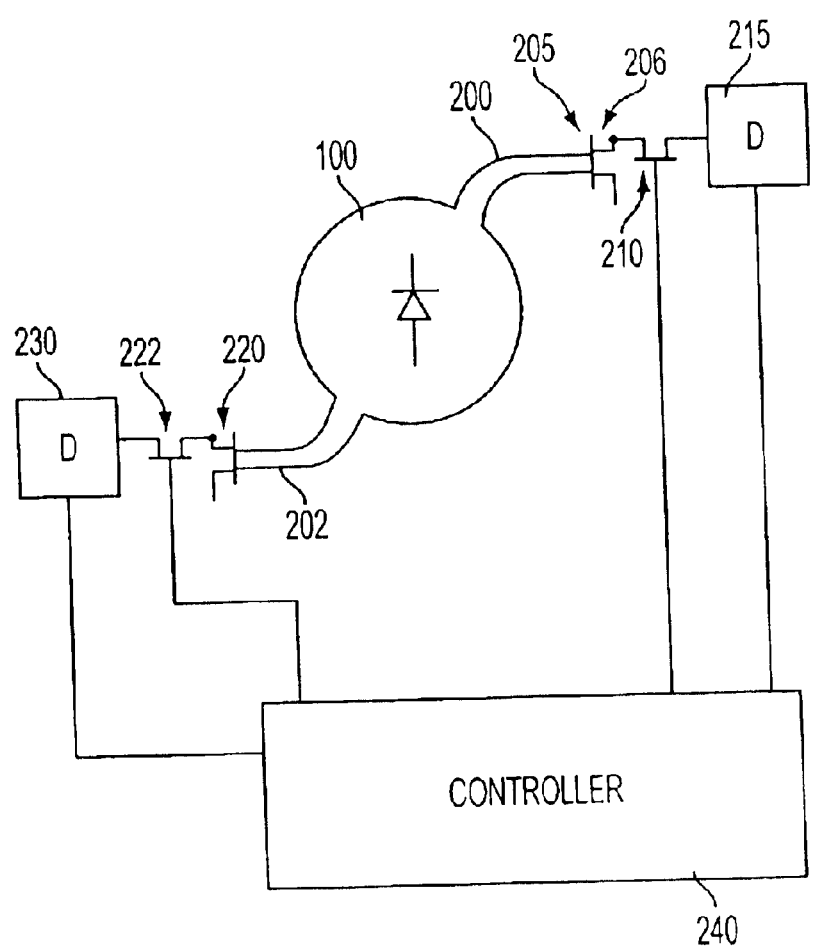
FIG. 2 shows a more detailed diagram of a single photodetector and its connection to two different acquisition sites.

A more detailed diagram of a single pixel is shown in FIG. 2. The photodetector 100, here shown as a photodiode, is shown as being generally round in outer cross-section. However, other shapes may be used to accommodate desired layouts, fill factors, and capacitance issues. The edge portions 200, 202 of the photodetector may taper to a narrower portion 200,202. The narrower portion is connected to the switching arrangement. For example, the narrower portion 200 connects to a pixel follower 205 which may be a transistor arranged as a follower. The output 206 is connected through a switching transistor 210. The switching transistor 210, when operated, couples its signal through to a storage cell 215. Analogously, the other output from the other end 202 is coupled through a follower 220, to an in line-switching transistor 222, and to the other drain 230.

The overall operation is controlled by a controller 240. Controller 240 includes outputs which may sample the values of drains 215, and may control the switching to the transistors 210, 222. In operation, the controller 240 may control first reading the reset levels of the storage cells 215, 230. Then, the switch 210 may be turned on to cause the light intensity-indicative signal to be transferred to the storage cell 215. The storage cell 215 may then be sampled again. During the time of sampling of the storage cell 215, or some time thereafter, switch 222 may be turned on to transfer charge to storage cell 230. Storage cell 230 may then be sampled.

The above has described an operation which is sequential in time. In this sequential operation, the two switches 210, 222 are never turned on the same time. However, alternatively, the operation may be parallel, with both pixels receiving the information at the same time. In this case, the two switches 210, 222 may be turned on at the same time.

This approach may improve the pixel's effective fill factor, leaving more area for the photodetector and hence creating a more light sensitive pixel geometry. This system may be well suited for freeze frame and/or interlaced pixels. This system may also allow for a non-spatially shifted image claim sampling.

The above has described operation in the context of an active pixel sensor. An active pixel sensor of the preferred embodiment may be a sensor which has all of its elements formed of MOS technology, e.g. photodetector portions formed of MOS, and control portions formed of CMOS. It should be understood that this architecture may be usable in other systems also, such as in a passive pixel sensor or a CCD. Special advantages, however, may be obtained in active pixel sensor, since more circuitry can be formed on the substrate itself.

Although only a few embodiments have been disclosed in detail above, other modifications are possible. For example, while the above describes connection of the photodetector to two different pixels, other numbers of pixels, including 3, 4, 5 or more different numbers of pixels could be connected to a single photodetector, using respective switching devices. In addition, the controller may control other operations of the image sensor. For example, the controller may control the times during which the photodetector is actually integrating light.

What is claimed is:

1. An image sensor comprising:
   a photodetector which receives light incident thereon and outputs information of the incident light as light signals;
   at least a first and second pixel associated with the photodetector, each having a respective storage region for storing a light signal for pixel output;
   a first switch located between the photodetector and the first pixel for selectively storing a light signal from said photodetector in the storage region of the first pixel; and
   a second switch located between the photodetector and the second pixel for selectively storing a light signal from said photodetector in the storage region of the second pixel.

2. The image sensor according to claim 1, wherein the first and second switches are operable such that each light signal output by the photodetector is stored in only one of the respective storage regions at of the least two pixels.

3. The image sensor according to claim 1, wherein the first and second switches are operable such that each light signal output by the photodetector is stored in each of the respective storage regions of the at least two pixels.

4. The image sensor according to claim 1, further comprising a controller for operating said first and second switches to control whether a light signal is received at either of the first or the second pixel.

5. The image sensor according to claim 4, wherein the controller also controls reading the at least two pixels for obtaining the light information stored therein.

6. An image sensor comprising:
   a semiconductor substrate;
   a plurality of photodetectors arranged on the semiconductor substrate; and
   a plurality of pixels arranged on the semiconductor substrate in a plurality of rows, such that each pixel is exclusively associated with one of the plurality of photodetectors and each photodetector is associated with at least two pixels in at least two rows, wherein each photodetector selectively outputs light signals to be stored in each of the respective at least two pixels associated with that photodetector.

7. The image sensor according to claim 6, wherein each light signal output by each photodetector is transferred for storage at a storage region of a selected one of the at least two pixels associated with that photodetector.

8. The image sensor according to claim 6, wherein each light signal output by each photodetector is stored in each of the at least two pixels associated with that photodetector.

9. The image sensor according to claim 6, further comprising a controller on the semiconductor substrate for selectively electrically connecting at least one of the at least two pixels associated with each photodetector to the respective photodetector so that light signals output from each photodetector are stored in the at least one of the respective at least two pixels selected by the controller.

10. The image sensor according to claim 6, wherein each pixel is formed of MOS transistors.

11. The image sensor according to claim 6, wherein the image sensor is a CMOS image sensor.

12. The image sensor according to claim 6, wherein the image sensor is a CCD image sensor.

13. A method of acquiring image information, comprising:
   integrating incident light on a photodetector to produce a first light signal and a second light signal;
   transferring the first light signal to a first image storage cell associated with the photodetector;
   transferring the second light signal to a second image storage cell associated with the photodetector; and
   outputting said first and second light signals from said first and said second image storage cells through respective first and second output circuits.

14. The method according to claim 13, wherein the first light signal is different from the second light signal, and the first light signal is transferred to the first image storage cell and then the second light signal is transferred to the second image storage cell in sequence.

15. The method according to claim 13, wherein the first light signal is different from the second light signal, the method further comprising transferring the first light signal to the second image storage cell and transferring the second light signal to the first image storage cell, wherein the transfer of each light signal to the first and second image storage cells occurs sequentially such that the first image storage cell receives the light signal and then the second image storage cell receives the light signal.

16. The method according to claim 13, wherein the first light signal is the same as the second light signal, the method further comprising transferring the first light signal to the first image storage cell and transferring the second light signal to the second image storage cell in parallel such that the first and second image storage cells both receive the respective light signals at the same time.

17. A method of acquiring image information, comprising:

integrating incident light on a photodetector to produce a light signal;

selectively transferring the light signal from a first and a second connection part on said photodetector respectively to each of at least a first and a second image storage cell associated with the photodetector.

18. The method according to claim 17, wherein the light signal is selectively transferred from the photodetector to each of the at least two image storage cells in sequence.

19. The method according to claim 17, wherein the light signal is selectively transferred from the photodetector to each of the at least two image storage cells in parallel.

20. The image sensor of claim 4, wherein the controller is constructed to operate the first and the second switch alternately.

21. The image sensor of claim 4, wherein the controller is constructed to operate the first and the second switch simultaneously.

22. The image sensor of claim 1, wherein the first switch is electrically coupled to a first connect location of said photodetector and the second switch is electrically coupled to a second connect location of said photodetector.

23. The image sensor of claim 1, further comprising a respective at least first and second output circuits associated with said at least first and second pixel.

24. The image sensor of claim 23, wherein the at least first and second output circuits each comprise a source follower transistor.

25. The method of claim 13, wherein the first image storage cell is in a first row of pixel cells and the second image storage cell is in a second row of pixel cells, and wherein the step of outputting a first light signal comprises reading out said first row of pixels.

26. The method of claim 13, wherein the step of transferring the first light signal comprises operating a first switch electrically coupled between a first location of said photodetector and said first storage cell.

27. The method of claim 26, wherein the step of transferring the second light signal comprises operating a second switch electrically coupled between a second location of said photodetector and said second storage cell.

28. The method of claim 17, further comprising the step of sampling a signal from each of the first and second image storage cells.

29. The method of claim 28, wherein the first image storage cell is in a first row of cells and the second image storage cell is in a second row, and wherein the step of sampling comprises reading out a signal stored in the cell in response to a signal applied to a selected row.

30. The method of claim 17, wherein the step of selectively transferring the light signal comprises operating first and second switches to transfer a signal from either of the first and second connection parts on the photosensor to a respective first and second storage cell.

* * * * *

UNITED STATES PATENT AND TRADEMARK OFFICE
CERTIFICATE OF CORRECTION

PATENT NO.   : 6,838,653 B2
DATED        : January 4, 2005
INVENTOR(S)  : Scott P. Campbell et al.

It is certified that error appears in the above-identified patent and that said Letters Patent is hereby corrected as shown below:

Column 2,
Line 5, "two coupled to" should read -- to couple the --.
Line 44, "rose" should read -- rows --.

Column 3,
Line 65, "regions at of" should read -- regions of --.

Signed and Sealed this

Twelfth Day of July, 2005

JON W. DUDAS
*Director of the United States Patent and Trademark Office*